| (12) | United States Patent | (10) Patent No.: | US 6,424,554 B1 |
|---|---|---|---|
| | Kawasumi | (45) Date of Patent: | Jul. 23, 2002 |

(54) SEMICONDUCTOR MEMORY WITH MULTISTAGE LOCAL SENSE AMPLIFIER

(75) Inventor: Atsushi Kawasumi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/661,819

(22) Filed: Sep. 14, 2000

(30) Foreign Application Priority Data

Sep. 17, 1999 (JP) .............................................. 11-264462

(51) Int. Cl.⁷ ................................................ G11C 5/06
(52) U.S. Cl. ...................... 365/63; 365/230.03; 365/205
(58) Field of Search ..................... 365/63, 205, 230.03, 365/189.01, 230.01

(56) References Cited

U.S. PATENT DOCUMENTS

| 5,585,747 A | * | 12/1996 | Proebsting ................... 327/55 |
| 5,696,726 A | * | 12/1997 | Tsukikawa ................... 365/205 |
| 5,719,815 A | * | 2/1998 | Takahashi et al. ........... 365/222 |
| 5,991,223 A | * | 11/1999 | Kozaru et al. ......... 365/230.03 |

* cited by examiner

*Primary Examiner*—Hoai V. Ho
(74) *Attorney, Agent, or Firm*—Banner & Witcoff, Ltd.

(57) ABSTRACT

Each memory cell is connected to a paired bit line. Each of the bit lines is connected to a PMOS transistor as a transfer gate, and each of the bit lines is connected to a first local sense amplifier via the PMOS transistor. These first local sense amplifiers are connected to a second local sense amplifier. The second local sense amplifier is connected to a data bus for outputting data stored in these cells. Since the semiconductor has multistage local sense amplifier, sense time for high-speed data outputting can be improved while increasing power at the sensing is restrained.

14 Claims, 6 Drawing Sheets

FIG.5

| 2nd \ 1st | POSITIVE LOGIC | NEGATIVE LOGIC |
|---|---|---|
| POSITIVE LOGIC | OR | NAND |
| NEGATIVE LOGIC | NOR | AND |

SEMICONDUCTOR MEMORY WITH MULTISTAGE LOCAL SENSE AMPLIFIER

CROSS REFERENCE TO RELATED APPLICATIONS

This application claims benefit of priority under 35 USC 119 based on Japanese patent application PH11-264462 filed Sep. 17, 1999 the entire contents of which are incorporated by reference herein.

BACKGROUND OF THE INVENTION

1. Field of the Invention

The present invention relates in general to a semiconductor memory device such as SRAM and in particular to a structure of a sense amplifier which amplifies data on bit lines of the semiconductor memory device.

2. Description of Related Art

FIG. 1 shows a circuit diagram of SRAM according to a related art. Each memory cell (cell) is connected to a paired bit line BL and EL (/BL or BLbar). These arrayed memory cells are called memory cell array. In this related art, there are eight paired bit lines (BL<0> and /BL<0> to BL<7> and /BL<7>), and each bit line is connected to a PMOS transistor T as a transfer gate. Each bit line is connected to a local sense amplifier 1 via the PMOS transistor T.

The circuit of FIG. 1 requires a plurality of local sense amplifiers 1 since these memory cells are arranged horizontally. The plurality of local sense amplifiers 1 is connected to a data bus 2 for outputting data stored in these cells.

The data bus 2 is connected to a global sense amplifier 3 connected an output buffer 4. The global sense amplifier 3 is generally arranged close to the output buffer 4.

The each memory cell (cell) is connected to a word line 5, and the each PMOS transistor T are connected to a control line 6.

The method of outputting data from this SRAM is explained below. Data stored in a memory cell connected to word line 5 selected according to row address are transferred to the bit line (for example BL<0> and /BL<0> of FIG. 1). And then, only the data in the bit line selected based on column address on the control line 6 is inputted to the local sense amplifier 1 via transfer gate T (for example, the first and second PMOS transistor from the left of the FIG. 1). The output data of the local sense amplifier 1 is outputted to the global sense amplifier 3 via the data bus 2. The global sense amplifier 3 amplifies the output data to output to the output buffer 4. The output buffer 4 may output the data to outside of this device.

In this semiconductor memory device of the related art, the static capacitance of data bus 2 increases very much in order to connect a large number of local sense amplifiers 1 (for example, sixty four (64)) to the data bus 2. Therefore, when the local sense amplifier 1 senses the data, it needs to charge a large static capacitance. Then, larger power is required in case of shorten senses time is required. Namely, there is a problem that the sense time is lengthened in case of less power supply to the local sense amplifier 1.

Here, it is possible to shorten the charging time of the static capacitance of the outputting data, if the power of local sense amplifier 1 is further increased. In general, however, the upper limit of electric power in the LSI chip is often predetermined. Therefore, there is a limit in increasing power of local sense amplifier 1 for faster outputting.

SUMMARY OF THE INVENTION

Accordingly, present invention is to provide a novel semiconductor memory device capable of improving sense time for high-speed data outputting, while increasing power at the sensing is restrained.

A semiconductor memory of the present invention comprises a plurality of paired bit lines; a plurality of memory cells; a plurality of first local sense amplifiers connected to at least one bit line of the paired bit lines, for amplifying data output from the bit lines; a plurality of second local sense amplifiers connected to the first local amplifiers, for amplifying data output from the first local sense amplifiers; and a data bus connected to the second local sense amplifiers, for transferring data output from the second local sense amplifiers.

BRIEF DESCRIPTION OF THE DRAWINGS

The objects, features and advantages of the present invention will become more apparent from the following description of a preferred embodiment taken in conjunction with the accompanying rawings, in which.

FIG. 5 is a diagram showing a logic for generating a control signal for controlling a second local sense amplifier.

DETAILED DESCRIPTION OF THE EMBODIMENTS

Figure 1:
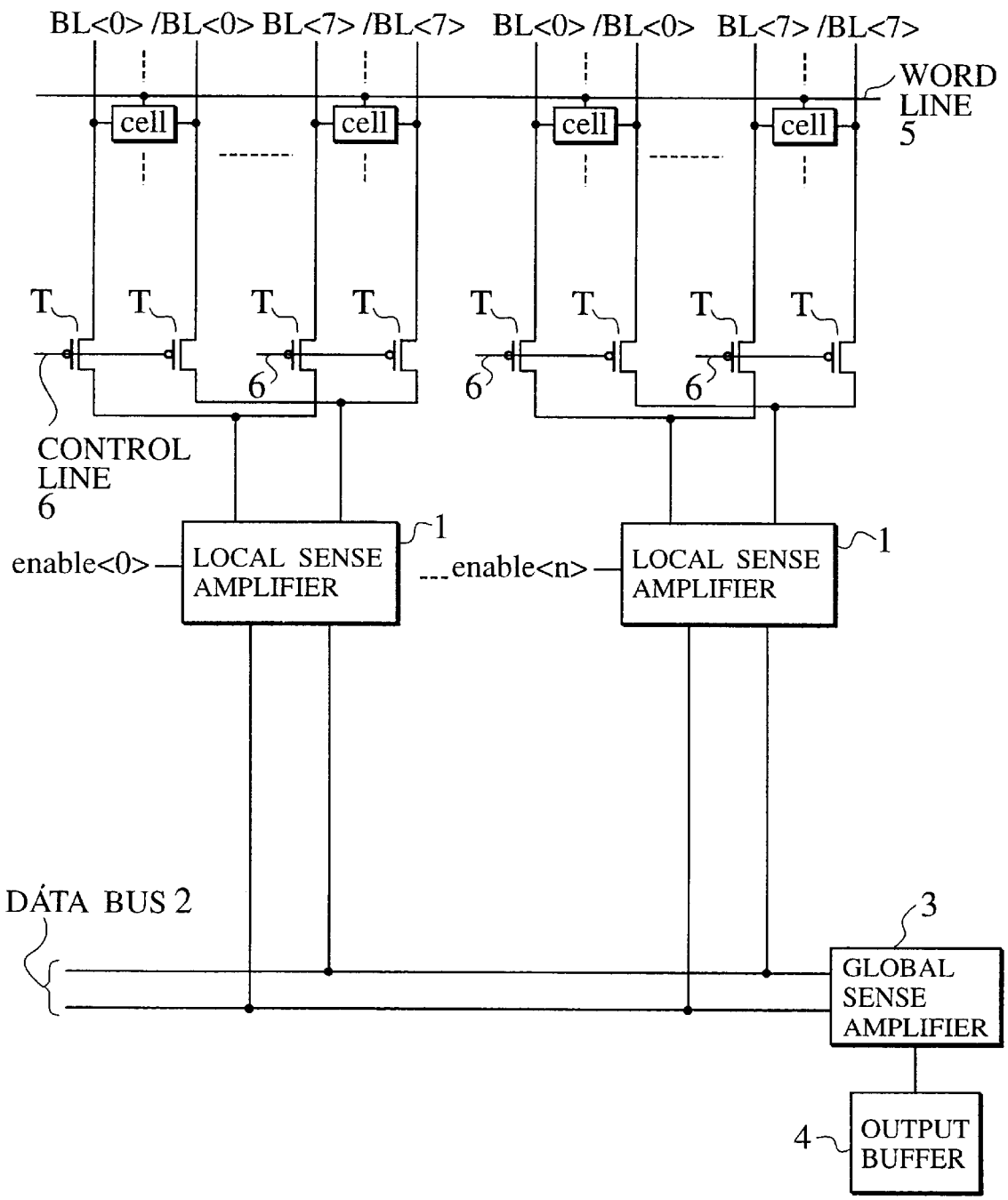
FIG. 1 is a circuit diagram showing a SRAM according to a related art.

Various embodiments of the present invention will be described with reference to the accompanying drawings. It is to be noted that the same or similar reference numerals are applied to the same or similar parts and elements throughout the drawings, and the description of the same or similar parts and elements will be omitted on simplified.

Figure 2:
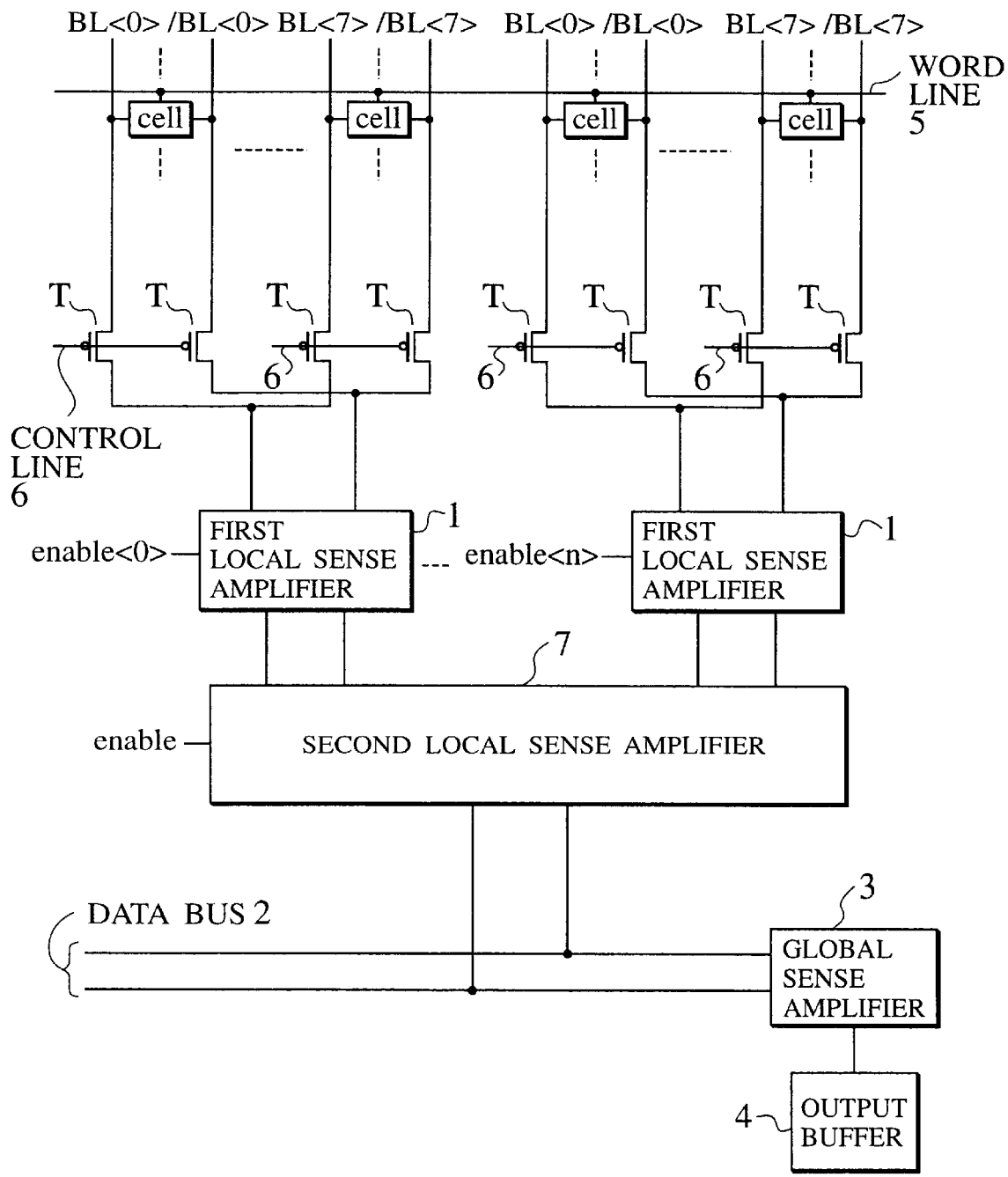
FIG. 2 is a circuit diagram showing a semiconductor memory device according to a first embodiment of the present invention.

FIG. 2 is a circuit diagram showing a semiconductor memory device according to a first embodiment of the present invention. Each memory cell (cell) is connected to a paired bit line BL and BL (/BL or BLbar). These arrayed memory cells are called memory cell array. In this embodiment, there are eight paired bit lines (BL<0> and /BL<0> to BL<7> and /BL<7>), and each bit line is connected to a PMOS transistor T as a transfer gate. Each bit line is connected to a local sense amplifier 1 via the PMOS transistor T. The circuit of FIG. 2 requires a plurality of local sense amplifiers 1 since these memory cells are arranged horizontally. These local sense amplifiers 1 are connected to a second local sense amplifier 7. The second local sense amplifier 7 is connected to a data bus 2 for outputting data stored in these cells.

The data bus 2 is connected to a global sense amplifier 3 connected an output buffer 4. The global sense amplifier 3 is generally arranged close to the output buffer 4. The each memory cell (cell) is connected to a word line 5, and the each PMOS transistor T is connected to a control line 6.

Both current sense type amplifier and voltage sense type amplifier can be applicable to the first local sense amplifier 1, the second local sense amplifier 7 and global sense amplifier 3 according to this embodiment. In general, the local sense amplifier amplifies output from a cell array, and the local sense amplifier is arranged close to the cell array. The global sense amplifier is usually arranged corresponding to an output buffer.

Next, the operation of this semiconductor memory device according to the first embodiment is explained. Data stored in a memory cell connected to word line 5 selected according to row address is transferred to the bit line (for example BL<0> and /BL<0> of FIG. 2). And then, only the data in the bit line selected based on column address on the control line 6 is inputted to the local sense amplifier 1 via transfer gate T (for example first and second PMOS transistor from the left of the FIG. 1). The output data of the local sense amplifier 1 is outputted to the second sense amplifier 7. The second sense amplifier senses the output data and outputs to the global sense amplifier 3 via the data bus 2. The global sense amplifier 3 amplifies the output data to output to the output buffer 4. The output buffer 4 may output the data to outside of this device.

The input of the second sense amplifier 7 is connected to the outputs of the plurality of the first sense amplifiers 1. The second sense amplifier 7 inputs data from the first amplifiers 1, amplifies the data, and outputs the data to the data bus 2. So, it is possible to reduce the number of sense amplifier connected to the data bus 2 by adding the second sense amplifier compared to the related art that each first local sense amplifier is connected directly to the data bus 2. Therefore, decreasing the static capacitance of the data bus 2 can be realized to add the second sense amplifier. These first local sense amplifier of 1 are connected to the second input of local sense amplifier 7. The number of the first local sense amplifier 1 connected to the second local sense amplifier 7 is not so large since the only first local sense amplifiers which are located in a predetermined region connect to the second sense amplifier. Therefore, the increasing static capacitance can be ignored. In related art, considerable electric power is required to drive the data bus 2 which has a large static capacitance since the data bus is connected to lots of local sense amplifiers. In this embodiment, less power is required to drive the data bus 2 since the data bus is connected less local sense amplifier(s). Therefore, the power consumption of the first local sense amplifier 1 can be reduced. And it is possible that the total power consumption including the consumption of the first local sense amplifier and the consumption of the second local sense amplifier at the sensing is less than that of the related art described above since static capacitance of the data bus 2 can be reduced even adding the second sense amplifier like a stratified Structure.

Therefore, rapid transition of the voltage of the data bus of 2 can be realized at less power of the first local sense amplifiers and second local sense amplifier arranged like a stratified structure.

Furthermore, it is possible to improve the data outputting by rapider transition of the data bus 2 by increasing the power of the second local sense amplifier since there is a margin power in sensing according to this invention.

In this embodiment, the second local sense amplifier is connected to a plurality of the first local sense amplifiers, and outputs data to the data bus 2. This enables to reduce the number of the local sense amplifier connected to the data bus 2. In general, the static capacitance is related to the sum length of the wiring connected to data bus, and the static capacitance increases if the sum length is lengthened. In this invention, it is to reduce interconnection length connected for data bus 2 by reducing the number of local sense amplifiers connected to the data bus 2, and it is possible to reduce the static capacitance of data bus 2. By this, it is possible that the sensing time is shortened even at the small power of the second local sense amplifier 7. And, the smaller power of the first local sense amplifier can be applicable since the number of first local sense amplifier connected to the second local sense amplifier is not so large so that the input static capacitance of the second local sense amplifier is very small.

Therefore, the sum of the power consumption of the first and that of the second local sense amplifiers can be reduced. For example, it can be reduced about thirty percent, but not limited to this. The data output speed can also be improved. For example, it can be improved about 10 percent, but not limited to this. Furthermore, the amplitude of data can be increased since the sense amplifier arranges like a multistage structure. Therefore, it is possible to restrain channel width of output transistors of the second local sense amplifier 7. It contributes reducing the static capacitance of data bus 2. The decrease of static capacitance contributes not only reducing the power consumption in sensing, but also reducing the sensing time.

It is prefer that the number of the first local sense amplifier 1 connected to the second local sense amplifier 7 (m) is more than and equal to two, and the number of the second local sense amplifier 7 (r) is less than or equal to the half of the first number of the local sense amplifier 1.

For example, if the number of the first local sense amplifiers 1 is sixty four (64), but not limited to this and the numbers of the first local sense amplifiers 1 connected to the second local sense amplifiers 7 is two (2), then the number of the second local sense amplifier 7 may become thirty two (32). And, the same case but and the numbers of the first local sense amplifiers 1 connected to the second local sense amplifiers 7 is four, then the number of the second local sense amplifier 7 may become sixteen (16). The optimum number can be determined based on the layouts of the semiconductor memory circuit.

In addition, the margin of the electric power is given by reducing the power of the sense amplifier. Then, Further speed up of the output data can be realized by using the margin of the electric power for the second local sense amplifier 7 to shorten the time in sensing of the second local sense amplifier 7. On the other hand, the second local sense amplifier consuming less power can be employed if the output data speed of the second local sense amplifier does not need to achieve high-speed. In this way, reducing power consumption can be realized.

Figure 3:
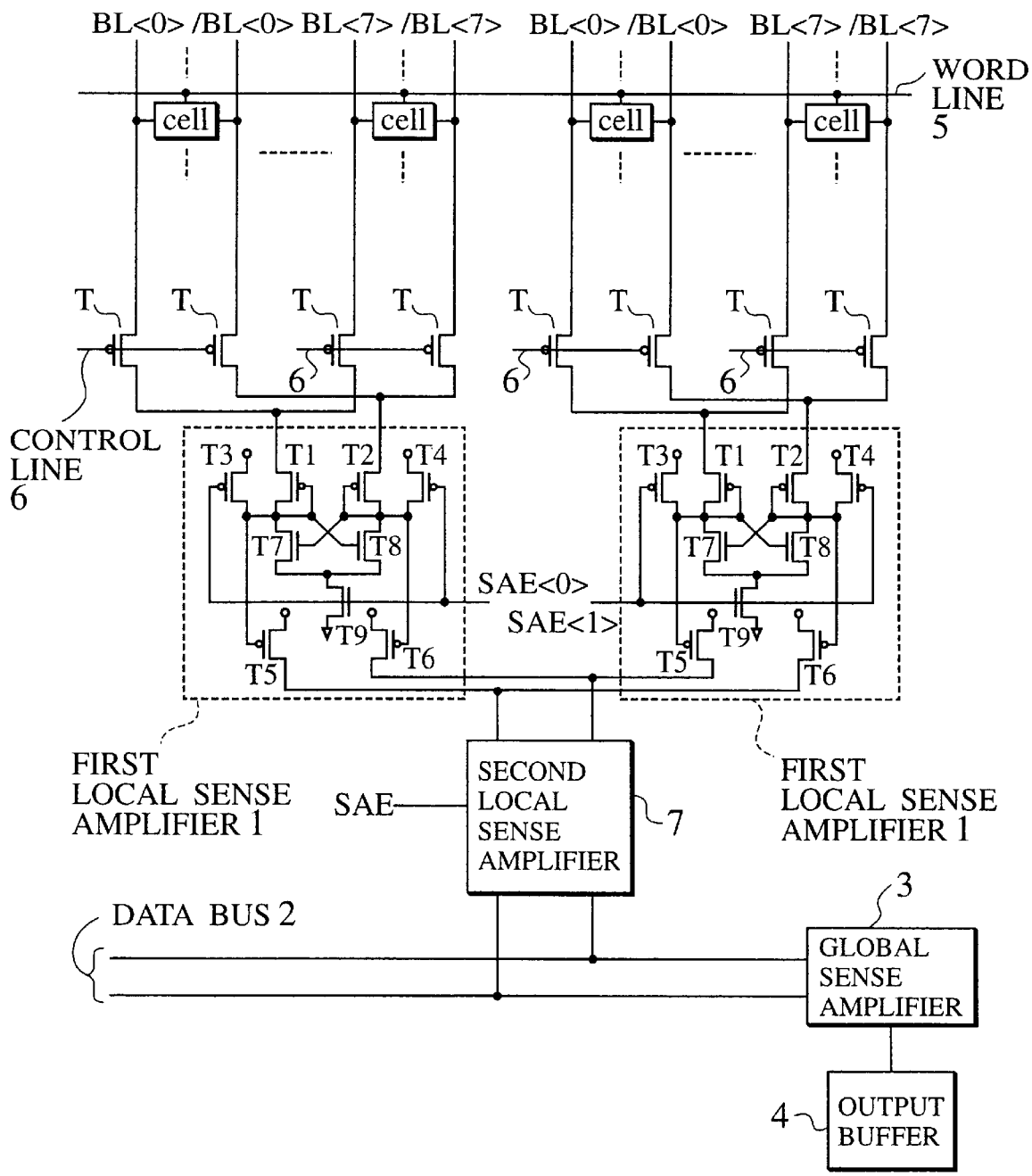
FIG. 3 is a circuit diagram showing a semiconductor memory device according to second embodiment of the present invention.

FIG. 3 is a circuit diagram showing a semiconductor memory device according to second embodiment of the present invention. This embodiment illustrates the detailed configuration example of the first local sense amplifier 1, and the two first local sense amplifier 1 is connected to the second local sense amplifier 7. The first local sense amplifier 1 comprises PMOS transistors T1 and T2 which form cross-coupled connection, NMOS transistors T7 and T8, PMOS transistors T3 and T4 which precharge to the first local sense amplifier in non-activation state, NMOS transistor T9 connecting the NMOS transistors T7 and T8 to the VSS level, and PMOS transistors T5 and T6 outputting high impedance at the activation state of the first local sense amplifier. Suppose this first local sense amplifier 1 is operated under the positive logic in this embodiment.

Next, the operation of this local sense amplifier is explained below. The enable signal SAE<0> is low level, the PMOS transistors T3 and T4 are the ON-state, and the NMOS transistor T9 is the OFF-state when the first local sense amplifier 1 has not been chosen.

In this situation, the VDD is applied to the gate of PMOS transistors T5 and T6. Then the PMOS transistors T5 and T6 become the OFF-state, and the output of the first local sense amplifier 1 becomes high impedance. In this case, the first local sense amplifier 1 is not operated at the non-activation state since VDD is applied to the gate and source of the PMOS transistors Ti and T2, and the gate and drain of the NMOS transistors T7 and T8, and the source of the NMOS transistors T7 and T8 are floated.

After that, PMOS transistor T3 and T4 are turned to the OFF-state, and NMOS transistor T9 is turned to the ON-state. Then, the cross-coupled PMOS transistor T1, T2 and NMOS transistor T7, T8 become activation state. In this situation, for example, a word line 5 is chosen according to a row address, and two PMOS transistors T (the left end in the figure) as a column address are turned to the ON-state. The data stored in the memory cell (CELL) is readout via bit line BL<0> and /BL<0>, and the current corresponding to this flows into PMOS transistors T1 and T2. At this time, the current difference between the current that flows into PMOS transistor T1 and that of T2 is converted into the voltage by PMOS transistors T7 and T8.

By this, the current corresponding to the voltage flows into the PMOS transistor T5 and T6, and the current flows into the second local sense amplifier 7. The second local sense amplifier 7 detects the current difference and outputs it to the data bus 2.

Here, VDD is the voltage of an inside power source, and VSS is the voltage of the ground level.

According to this embodiment, the output of a first local sense amplifier becomes high impedance since PMOS transistors T5 and T6 are the OFF-state in case of the first local sense amplifier is non-activation state. Then, the other first local sense amplifier can operate at activation state without effect by the first local sense amplifier. And, high-speed data outputting can be realized without the circuit which switches the input of the second local sense amplifiers 7, switching signal, and margin for the switching.

Furthermore, it is possible to reduce the power consumption in sensing, and shorten the sense time because static capacitance of the data bus 2 can be reduced according to this invention. Also, high-speed data outputting can be realized without increasing the power in sensing.

An input switching unit connected to the input of the second circuit can be applicable in case that the output of the first local sense amplifier 1 does not change to high impedance state when the first local sense amplifier is non-activation state. The input switching unit only inputs the output signal by the first local sense amplifier 1 which is activation state. But it is necessary to switch the circuit by an input switching control signal. In this case, it is also applicable if the timing of the input switching control signal is taken.

Generally, the timing margin of the control signal is required so that more sense time is needed in comparison with above embodiment. Then, this case is not suited for high-speed operation. But the reduction of power consumption in sensing can be achieved. In this case, the circuit will be simplified since the first output of local sense amplifier 1 does not need to be high-impedance at the non-active state.

Figure 4:
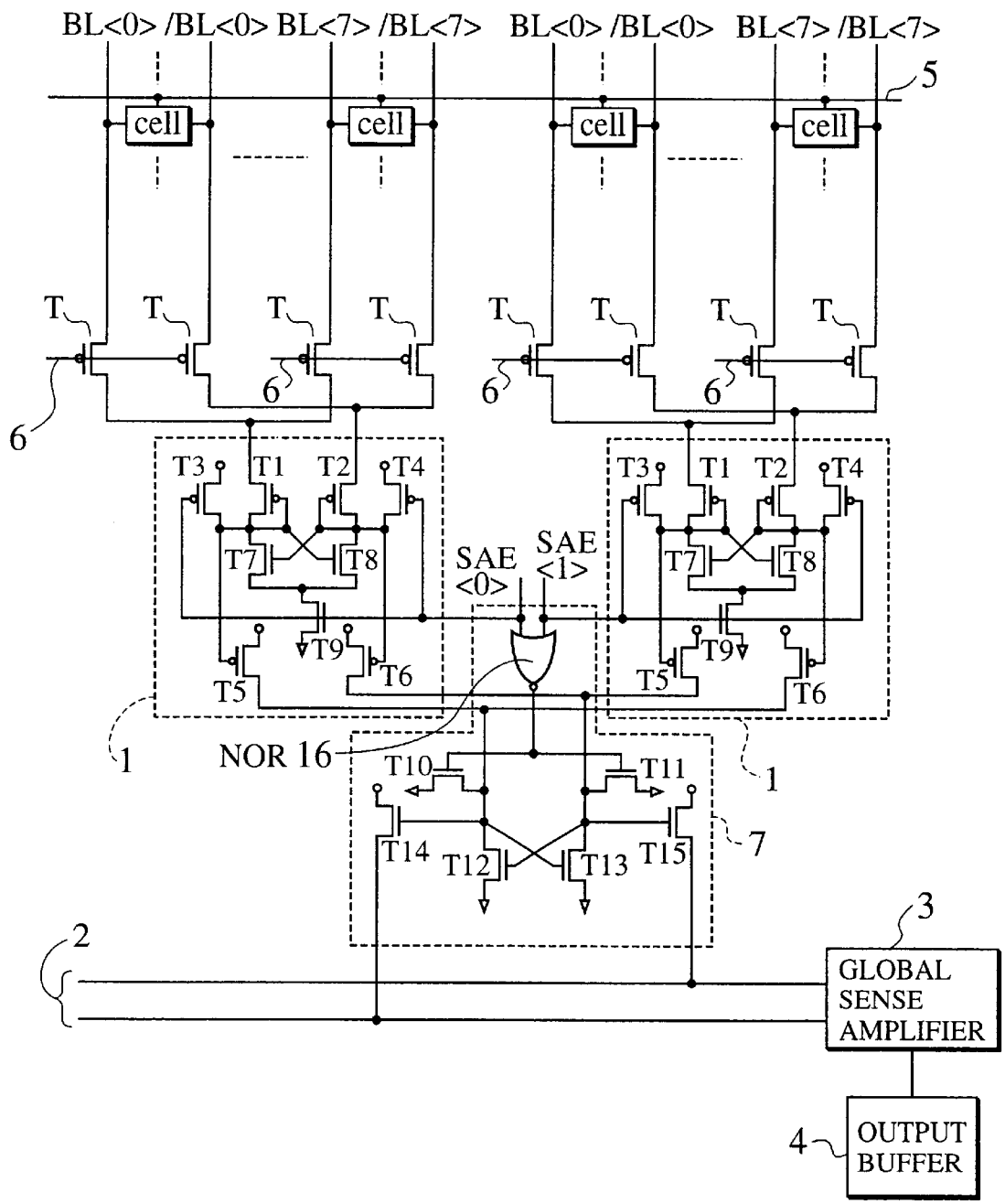
FIG. 4 is a circuit diagram showing a semiconductor memory device according to third embodiment of the present invention.

FIG. 4 is a circuit diagram showing a semiconductor memory device according to third embodiment of the present invention. This figure shows an example of the second local sense amplifier 7. The second local sense amplifier 7 has NMOS transistors T12 and T13 that are the voltage translate circuit, and NMOS transistors T14 and T15 which drive in data bus 2. In addition, the second local sense amplifier 7 has NMOS transistors T10 and T11 that precharge this amplifier, and an NOR circuit that generates control signal to change the status between non-activation and activation of the second local sense amplifier 7.

Next, the second operations of local sense amplifiers 7 will be explained. For example, when enable signal SAE<0> is the high level (then, SAE<1> is the low level at this time) and first local sense amplifier 1 of left side in the figure is selected and is activated, then an output of NOR circuits 16 becomes the low level, and NMOS transistor T10 and T11 become OFF state. By this, the second paired input lines of local sense amplifiers of 7 are released from the VSS level, and NMOS transistor T12 and T13 input a paired output current of first local sense amplifier 1 of left side in the figure. The difference between the paired output current of the first local sense amplifier is converted into a voltage by the NMOS transistors T12 and T13. And the voltage is inputted to the gate of the NMOS transistors T14 and T15. The NMOS transistors T14 and T15 output currents corresponding to the voltage to the data bus 2. Here, if enable signal SAE<0>, or SAE<1> is activation state and high level, then the output of the NOR circuit 16 becomes low level, and the second local sense amplifier 7 becomes activation state. However, when the both enable signals SAE<0> and SAE <1> are low level, then the output of the NOR circuit 16 becomes high level, and the transistors T10 and T11 of the second local sense amplifier 7 become the ON-state, so that the data line is set VSS level and the gate of the transistor T14 and T15 is also set VSS level. Therefore, NMOS transistor T14 and T15 becomes the OFF-state, then the second local sense amplifier 7 becomes non-activate status. In this time, the output of the second local sense amplifier becomes high-impedance.

The first local sense amplifier according to this embodiment operates under positive logic, and the second sense amplifier operates under negative logic. Then, the control signal of the second local sense amplifier 7 are generated to be outputted NOR logic of enable signal SAE<0> and SAE<1> by NOR circuit 16. On the other hand, the first local sense amplifier 1 according to this embodiment operates under positive logic, and the second sense amplifier also operates under positive logic. Then, the control signal of the second local sense amplifier 7 is generated to output OR logic of enable signal SAE<0> and SAE<1>. In this way, as shown in FIG. 5, there are various combinations between them.

According to the this local sense amplifier 1 of the embodiment, the second control signals of local sense amplifier of 7 are generated using enable signal SAE<0> and SAE<1>. Then, the difference between the enable time of the local sense amplifier 1 and that of the second local sense amplifiers 7 becomes fixed, independent of the place in the LSI chip. Therefore, the high-speed readout of the data is carried out owing to improving timing margin of the sense amplifier.

Figure 6:
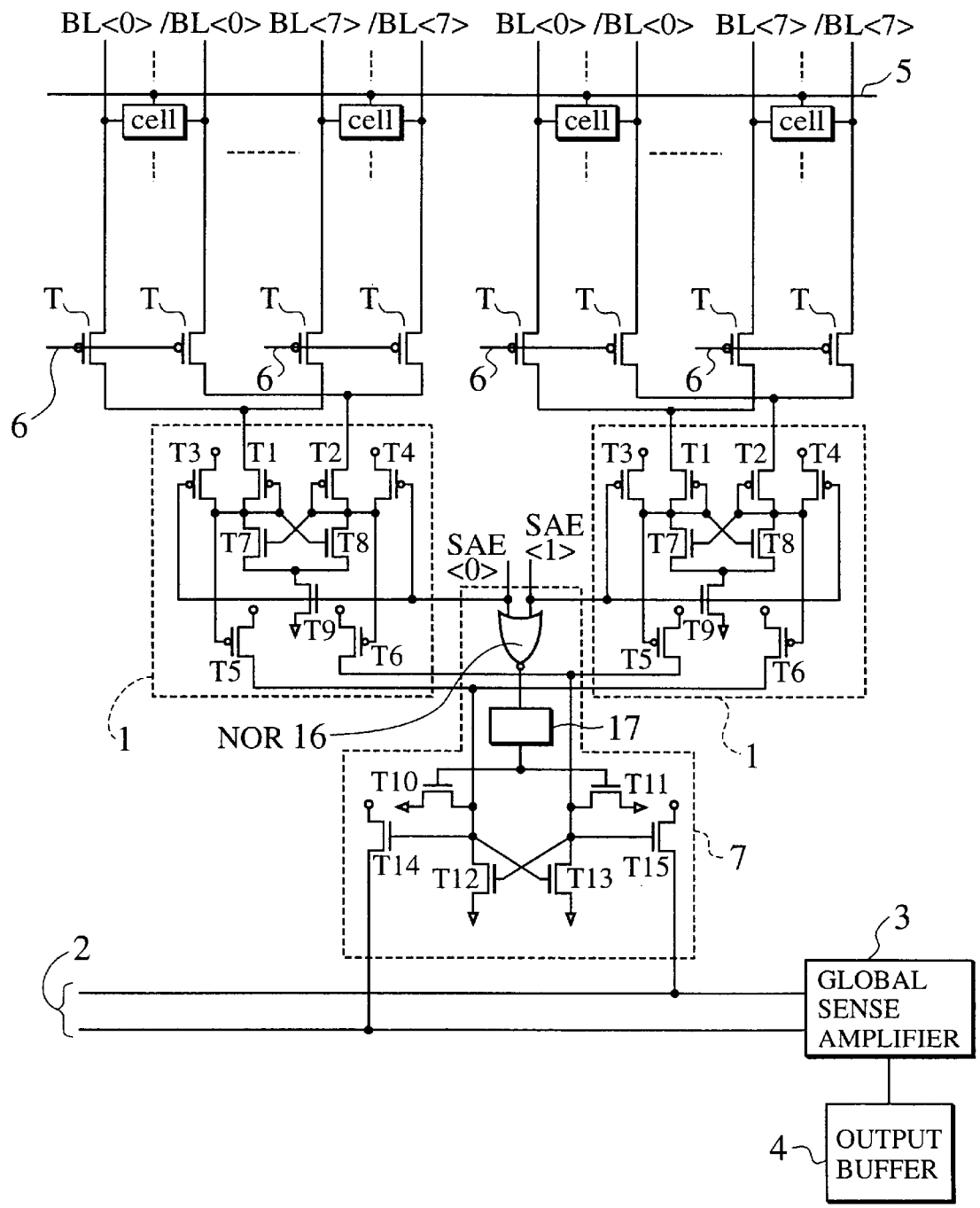
FIG. 6 is a circuit diagram showing a semiconductor memory device according to fourth embodiment of the present invention.

FIG. 6 is a circuit diagram showing a semiconductor memory device according to fourth embodiment of the present invention. In this embodiment, a delay circuit 17 is connected to an output of NOR circuit. This delay circuit will be explained.

The amplification of the output of the first sense amplifier 1 is sometimes delayed due to such as manufacturing dispersions. In this case, delay circuit 17 is connected to the output of the NOR circuit 16 in order to output the control the second local sense amplifier of 7. The delay circuit prevents misreading because the second local sense amplifier 7 inputs the control signal after the amplification of the first sense output of local sense amplifier 1. Then, The second local sense amplifier 7 is always able to read the proper data. An inverter chain will be employed as this delay circuit.

In summary, the present invention provides a novel semiconductor memory device capable of improving sense time for high-speed data outputting, while increasing power at the sensing is restrained in order to have a multistage amplifiers according to these embodiments as the above be explained.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A semiconductor memory comprising:
    a plurality of paired bit lines;
    a plurality of first local sense amplifiers coupled to at least one of the paired bit lines, configured to amplify data output from the bit lines, each of the first sense amplifiers comprising:
        a first transistor having a drain coupled to a bit line of the paired bit line;
        a second transistor having a drain coupled to another bit line of the paired bit line;
        a third transistor having a drain to which an internal power voltage is supplied, and a source coupled to a source of the first transistor;
        a fourth transistor having a drain to which the internal power voltage is supplied, and a source coupled to a source of the second transistor;
        a fifth transistor having a drain to which the internal power voltage is supplied, and a gate coupled to a source of the third transistor;
        a sixth transistor having a drain to which the internal power voltage is supplied, and a gate coupled to a source of the fourth transistor;
        a seventh transistor having a drain coupled to the first transistor, and a gate coupled to a gate of the second transistor;
        a eighth transistor having a drain coupled to the second transistor, and a gate coupled to a gate of the first transistor; and
        a ninth transistor having a drain coupled to a source of the seventh transistor and that of the eighth transistor, and a source to which a ground level voltage is supplied;
    a plurality of second local sense amplifiers coupled to the plurality of first local sense amplifiers, configured to amplify the data output from the first local sense amplifiers; and
    a data bus coupled to the second local sense amplifiers, configured to transfer the data output from the second local sense amplifiers.

2. The semiconductor memory as claimed in claim 1, the first and second local sense amplifiers are arranged close to the cell array.

3. A semiconductor memory comprising:
    a plurality of paired bit lines;
    a plurality of first local sense amplifiers coupled to at least one of the paired bit lines, configured to amplify data output from the bit lines;
    a plurality of second local sense amplifiers coupled to the plurality of first local sense amplifiers, configured to amplify the data output from the first local sense amplifiers, each of the second sense amplifiers comprising:
        a first transistor coupled to a first output of the first local sense amplifier, to which the ground level voltage is supplied;
        a second transistor coupled to a second output of the first local sense amplifier, to which the ground level voltage is supplied;
        a third transistor having a drain coupled to the first output of the first local sense amplifier, a source to which the ground level voltage is supplied, and a gate coupled to the second output of the first local sense amplifier;
        a fourth transistor having a drain coupled to the second output of the first local sense amplifier, a source to which the ground level voltage is supplied, and a gate coupled to the first output of the first local sense amplifier;
        a fifth transistor having a gate coupled to the drain of the fourth transistor, a drain to which the internal power voltage is supplied, and a source coupled to the data bus; and
        a sixth transistor having a gate coupled to the drain of the third transistor, a drain to which the internal power voltage is supplied, and a source coupled to the data bus; and
    a data bus coupled to the second local sense amplifiers, configured to transfer the data output from the second local sense amplifiers.

4. The semiconductor memory claimed in claim 3, wherein the second local sense amplifier further comprising:
    a logic circuit configured to generate a control signal which the second local sense amplifier becomes activation state based on an enable signal which the first local sense amplifier becomes activation state.

5. The semiconductor memory claimed in claim 4, wherein the second local sense amplifier further comprising:
    a delay circuit coupled to the logic circuit, configured to delay the control signal from the logic circuit and outputting the delayed control signal to the gate of first and second transistors.

6. The semiconductor memory as claimed in claim 3, the first and second local sense amplifiers are arranged close to the cell array.

7. A semiconductor memory comprising:
    a plurality of paired bit lines;
    a plurality of first local sense amplifiers coupled to at least one of the paired bit lines, configured to amplify data output from the bit lines;
    a plurality of second local sense amplifiers coupled to the plurality of first local sense amplifiers, configured to amplify the data output from the first local sense amplifiers, each of the second local sense amplifiers comprising:
        a first transistor coupled to a first output of the first local sense amplifier, to which the ground level voltage is supplied;
        a second transistor coupled to a second output of the first local sense amplifier, to which the ground level voltage is supplied;

a third transistor having a drain coupled to the first output of the first local sense amplifier, a source to which the ground level voltage is supplied, and a gate coupled to the second output of the local sense amplifier;

a fourth transistor having a drain coupled to the second output of the first local sense amplifier, a source to which the ground level voltage is supplied, and a gate coupled to the first output of the local sense amplifier;

a fifth transistor having a gate coupled to the drain of the fourth transistor, a drain to which the internal power voltage is supplied, and a source coupled to the data bus; and a sixth transistor having a gate coupled to the drain of the third transistor, a drain to which the internal power voltage is supplied, and a source coupled to the data bus; and a data bus coupled to the second local sense amplifiers, configured to transfer the data output from the second local sense amplifiers.

8. The semiconductor memory claimed in claim 7, wherein the second local sense amplifier further comprising:

a logic circuit configured to generate a control signal which the second local sense amplifier becomes activation state based on an enable signal which the first local sense amplifier becomes activation state.

9. The semiconductor memory claimed in claim 8, wherein the second local sense amplifier further comprising:

a delay circuit coupled to the logic circuit, configured to delay the control signal from the logic circuit and outputting the delayed control signal to the gate of the first and second transistors.

10. The semiconductor memory as claimed in claim 7, the first and second local sense amplifiers are arranged close to the cell array.

11. A semiconductor memory comprising:

a plurality of paired bit lines;

a first local sense amplifier coupled to at least one bit line of the paired bit lines, for amplifying data output from the bit lines, the first local sense amplifier comprising:

a first transistor having a drain coupled to a bit line of the paired bit line;

a second transistor having a drain coupled to another bit line of the paired bit line;

a third transistor having a drain to which an internal power voltage is supplied, and a source coupled to a source of the first transistor;

a fourth transistor having a drain to which the internal power voltage is supplied, and a source coupled to a source of the second transistor;

a fifth transistor having a drain to which the internal power voltage is supplied, and a gate coupled to a source of the third transistor;

a sixth transistor having a drain to which the internal power voltage is supplied, and a gate coupled to a source of the fourth transistor;

a seventh transistor having a drain coupled to the first transistor, and a gate coupled to a gate of the second transistor;

a eighth transistor having a drain coupled to the second transistor, and a gate coupled to a gate of the first transistor; and a ninth transistor having a drain coupled to a source of the seventh transistor and that of the eighth transistor, and a source to which the ground level voltage is supplied;

a second local sense amplifier coupled to the other bit lines of the paired bit lines, for amplifying the data output from the bit lines;

a third local sense amplifiers electrically coupled between the first local amplifiers and the second local sense amplifier, for amplifying data output from the first local sense amplifier and the second local sense amplifier; and a data bus coupled to the third local sense amplifiers, for transferring the data output from the third local sense amplifiers.

12. The semiconductor memory claimed in claim 11, wherein the third local sense amplifier comprising:

a first transistor coupled to an output of the first local sense amplifier, to which the ground level voltage is supplied;

a second transistor coupled to an output of the second local sense amplifier, to which the ground level voltage is supplied;

a third transistor having a drain coupled to the output of the first local sense amplifier, a source to which the ground level voltage is supplied, and a gate coupled to the output of the second local sense amplifier;

a fourth transistor having a drain coupled to the output of the second local sense amplifier, a source to which the ground level voltage is supplied, and a gate coupled to the first output of the first local sense amplifier;

a fifth transistor having a gate coupled to the drain of the fourth transistor, a drain to which the internal power voltage is supplied, and a source coupled to the data bus;

a sixth transistor having a gate coupled to the drain of the third transistor, a drain to which the internal power voltage is supplied, and a source coupled to the data bus.

13. The semiconductor memory claimed in claim 12, wherein the second local sense amplifier further comprising:

a logic circuit configured to generate a control signal which the third local sense amplifier becomes activation state based on an enabled signal which the first local sense amplifier becomes activation state.

14. The semiconductor memory claimed in claim 13, wherein the second local sense amplifier further comprising:

a delay circuit coupled to the logic circuit, configured to delay the control signal from the logic circuit and output the delayed control signal to the first and second transistors.

* * * * *